United States Patent
Mandelman et al.

(10) Patent No.: US 6,720,630 B2
(45) Date of Patent: Apr. 13, 2004

(54) STRUCTURE AND METHOD FOR MOSFET WITH METALLIC GATE ELECTRODE

(75) Inventors: Jack A. Mandelman, Stormville, NY (US); Oleg Gluschenkov, Wappingers Falls, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,874

(22) Filed: May 30, 2001

(65) Prior Publication Data

US 2002/0182822 A1 Dec. 5, 2002

(51) Int. Cl.[7] .............................. H01L 29/76
(52) U.S. Cl. ................. 257/406; 257/288; 257/411; 257/412; 257/900
(58) Field of Search ............... 257/288, 406, 257/411, 412, 900

(56) References Cited

U.S. PATENT DOCUMENTS 5,286,994 A * 2/1994 Ozawa et al. ............... 257/324
6,037,630 A * 3/2000 Igarashi et al. ............. 257/336
6,037,639 A * 3/2000 Ahmad ....................... 257/401
6,346,734 B2 * 2/2002 Divakaruni et al. ........ 257/388

FOREIGN PATENT DOCUMENTS

JP  3 62-216370 A * 9/1987  ............... 257/411

* cited by examiner

Primary Examiner—Allan R. Wilson
Assistant Examiner—Matthew E. Warren
(74) Attorney, Agent, or Firm—Scully Scott Murphy & Presser; Tiffany L. Townsend, Esq.

(57) ABSTRACT

A method of forming a metal oxide semiconductor field effect transistor (MOSFET) having a metallic gate electrode that is protected with hanging sidewall spacers during a subsequent gate oxidation process is provided. A semiconductor structure formed by the inventive method is also provided. Specifically, the inventive semiconductor structure includes a semiconductor substrate comprising a patterned gate region formed atop a patterned gate dielectric, the patterned gate region includes at least a metallic gate electrode formed atop a polysilicon gate electrode; hanging sidewall spacers formed on an upper portion of the patterned gate region including the metallic gate electrode; and a thermal oxide layer formed on lower portions of patterned gate region including a portion of the polysilicon gate electrode, but not the metallic gate electrode.

21 Claims, 3 Drawing Sheets

STRUCTURE AND METHOD FOR MOSFET WITH METALLIC GATE ELECTRODE

FIELD OF THE INVENTION

The present invention relates to semiconductor devices, and more particularly to a metal oxide semiconductor field effect transistor (MOSFET) which comprises a patterned gate stack region that includes a metallic gate electrode formed atop a polysilicon gate electrode, wherein sidewall spacers are present on a portion of the patterned gate stack region such that the metallic gate electrode is protected from being oxidized during a subsequent sidewall oxidation process. The present invention also relates to a method of fabricating the inventive MOSFET.

BACKGROUND OF THE INVENTION

Modern Si-based metal-insulator-semiconductor (MIS) field effect transistors (FETs) are fabricated with the use of so-called sidewall or corner oxidation of the gate corner. Sidewall oxidation processes are routinely employed in conventional process flows such as complementary metal oxide semiconductor (CMOS) logic, static random access memory (SRAM), dynamic random access memory (DRAM), embedded DRAM, flash memories and other like processing flows.

As is known to those skilled in the art, sidewall oxidation of the gate corners thickens the gate insulator, e.g., gate dielectric, at the gate corner. Thick corner insulators prevent electrical breakdown at the device corners. The corner insulator also reduces the electric field by effectively rounding the corner during oxidation. A higher gate corner electric field can produce gate induced drain leakage (GIDL) and large hot-carrier effects leading to poor transistor reliability. In addition, the planar oxide grown during corner oxidation is used as a screen oxide for a subsequent ion-implantation step, thus, simplifying process integration flow. All these benefits of sidewall (or corner) oxidation are well known in the art; therefore a detailed discussion concerning the same is not needed herein.

When the gate region includes a low-resistivity metallic gate electrode, the sidewall oxidation process typically causes degradation of the metallic gate. This degradation is caused by junction diffusion that occurs during the high-temperature sidewall oxidation process. Moreover, during high-temperature sidewall oxidation, portions of the metallic gate are oxidized. Oxidation of the metallic gate electrode is undesirable since it results in an increase in the resistivity of the gate region.

Another problem with conventional FET devices is that the adjoining lightly doped source/drain regions and halo implant regions which are formed into a surface of a semiconductor substrate are subjected to the thermal cycle used in activating the heavily doped source/drain diffusion regions. This occurs because the lightly doped source/drain regions and/or halo implants are typically formed prior to formation of the heavily doped source/drain diffusion regions. It is emphasized that subjecting the lightly doped source/drain regions and/or halo implants to the thermal cycle of activating the heavily doped source/drain diffusion regions is undesirable since the impurity dopants will diffuse and alter the junction depth profile during thermal processing.

In view of the above problems with prior art metallic gate structures, there is a continued need for developing a new and improved MOSFET in which the metallic gate is protected in a manner such that the metallic gate is not degraded during a subsequent sidewall oxidation process.

SUMMARY OF THE INVENTION

One object of the present invention is to provide a MOSEFT which includes a metallic gate electrode formed atop a polysilicon gate electrode in which the metallic gate electrode is highly resistant to high-temperature degradation during a subsequent sidewall oxidation process.

Another object of the present invention is to provide a MOSFET with a metallic gate electrode wherein the lightly doped source/drain regions and/or halo implant regions are not affected by activation of heavily doped source/drain diffusion regions.

A yet other object of the present invention is to provide a MOSFET with a metallic gate electrode wherein the MOSFET is formed utilizing processing steps, including typical sidewall oxidation processes, that are compatible with existing CMOS processing steps.

These and other objects and advantages are achieved in the present invention by protecting the metallic gate electrode sidewall with a localized oxidation barrier and by forming the heavily doped source/drain diffusion regions in the substrate prior to forming the lightly doped source/drain regions and/or halo implant regions. The localized oxidation barrier which is formed on at least the sidewalls of the metallic gate electrode is referred herein as a hanging spacer.

One aspect of the present invention thus relates to a method of forming a MOSFET having a metallic gate electrode that is protected from high-temperature degradation. Specifically, the inventive method of the present invention comprises the steps of:

(a) forming a placeholder dielectric on exposed horizontal surfaces of a semiconductor structure, said semiconductor structure comprising at least a semiconductor substrate having a patterned gate dielectric and a patterned gate region formed thereon, wherein said patterned gate region comprises at least a metallic gate electrode formed atop a polysilicon gate electrode;

(b) forming sidewall spacers on exposed sidewalls of said patterned gate region and on a surface of said placeholder dielectric;

(c) removing said placeholder dielectric from said semiconductor structure so as to at least expose a portion of said polysilicon gate electrode of said patterned gate region, but not said metallic gate electrode;

(d) performing a sidewall oxidation process so as to form a thermal oxide layer on at least said exposed portion of said polysilicon gate electrode, but not said metallic gate electrode;

(e) forming heavily doped source/drain diffusion regions in said semiconductor substrate; and (f) forming lightly doped source/drain regions, halo implant regions or both said lightly doped source/drain regions and halo implant regions in said semiconductor substrate.

Another aspect of the present invention relates to a semiconductor structure which is fabricated utilizing the inventive method recited above. Specifically, the semiconductor structure of the present invention comprises:

a semiconductor substrate comprising a patterned gate region formed atop a patterned gate dielectric, said patterned gate region including at least a metallic gate electrode formed atop a polysilicon gate electrode;

sidewall spacers, i.e., hanging spacers, formed on an upper portion of said patterned gate region including at least said metallic gate electrode; and a thermal oxide layer formed on lower portions of said patterned gate region including a portion of said polysilicon gate electrode, but not said metallic gate electrode.

DETAILED DESCRIPTION OF THE INVENTION

Figure 1:
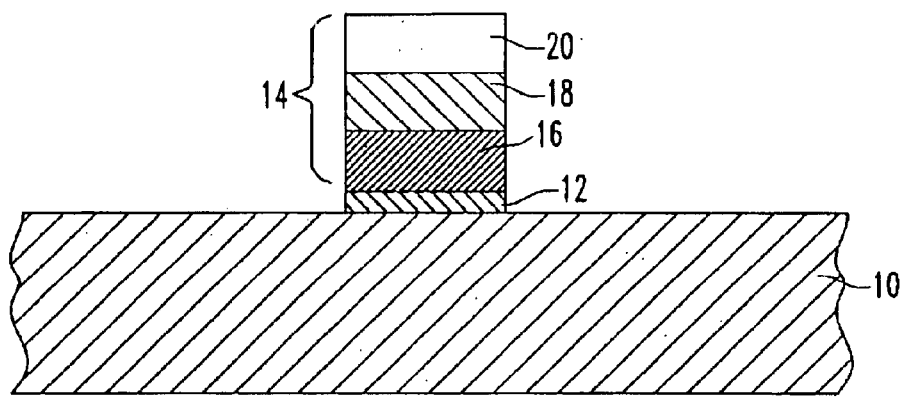
FIGS. 1–9 are pictorial representations (through cross-sectional views) showing the inventive MOSFET during various processing steps of the present invention.

The present invention, which is directed to a MOSFET structure that includes a metallic gate electrode and a method of fabricating the same, will now be described in more detail by referring to the drawings that accompany the present application. It is noted that in the accompanying drawings like and/or corresponding elements are referred to by like reference numerals. Moreover, the present invention is not limited to forming one MOSFET, instead the present invention works in fabricating a plurality of MOSFETs on a surface of a semiconductor substrate.

Reference is first made to FIG. 1 which illustrates an initial structure that is employed in the present invention. Specifically, the initial structure shown in FIG. 1 comprises semiconductor substrate 10, patterned gate dielectric 12 formed on a surface of semiconductor substrate 10 and patterned gate stack region 14 formed atop patterned gate dielectric 12. The patterned gate stack region includes polysilicon gate electrode 16, metallic gate electrode 18, and dielectric capping layer 20. Optionally, a barrier layer may be formed between the polysilicon gate electrode and the metallic gate electrode. Although only one patterned gate region is shown, the present invention contemplates instances wherein a plurality of patterned gate regions are present.

The initial structure illustrated in FIG. 1 is composed of conventional materials well known to those skilled in the art and conventional processes that are also well known in the art are employed in fabricating the same. For example, semiconductor substrate 10 is comprised of any semiconductor material including, but not limited to: Si, Ge, SiGe, GaAs, InAs, InP and all other III/V semiconductor compounds. Layered substrates comprising the same or different semiconductor material, e.g., Si/Si or Si/SiGe, as well as silicon-on-insulators (SOIs) are also contemplated in the present invention. The substrate may be of the n or p-type depending on the desired device to be fabricated. The substrate may contain active device regions, wiring regions, isolation regions and other like regions that are typically associated with MOSFET devices. For clarity, these regions are not shown in the drawings, but are meant to be included within substrate 10. In a highly preferred embodiment of the present invention, semiconductor substrate 10 is comprised of Si.

A layer of gate dielectric material, such as an oxide, nitride, oxynitride or any combination thereof, is then formed on the surface of semiconductor substrate 10 utilizing a conventional process well known in the art. For example, a conventional deposition process such as chemical vapor deposition (CVD), plasma-assisted CVD, evaporation and chemical solution deposition may be employed, or alternatively, a conventional thermal process such as oxidation, nitridation, and oxynitridation, may be used in growing the gate dielectric material on the surface of semiconductor substrate 10. Note that the layer of gate dielectric material formed in this step of the present invention will be subsequently patterned into patterned gate dielectric 12. The thickness of the gate dielectric material is not critical to the present invention, but typically, the gate dielectric material has a thickness of from about 1 to about 10 nm, with a thickness of from about 1.5 to about 2.5 nm being more highly preferred. It is noted that the gate dielectric material employed in the present invention may be a conventional dielectric material such as $SiO_2$ or $Al_3N_4$, or alternatively high-k dielectrics such as oxides of Ta, Zr, Al or combinations thereof may also be employed. In a highly preferred embodiment of the present invention, gate dielectric 12 is comprised of an oxide such as $SiO_2$, $ZrO_2$, $Ta_2O_5$ or $Al_2O_3$.

After forming the layer of gate dielectric on the surface of semiconductor substrate 10, a polysilicon layer (which will be subsequently patterned into polysilicon gate electrode 16) is then formed on the layer of gate dielectric material utilizing a conventional deposition process such as CVD or plasma-assisted CVD. Following deposition of the polysilicon layer, the deposited polysilicon is doped with an appropriate dopant, or alternatively, an in-situ doping deposition process is employed in forming the polysilicon layer. The thickness of the polysilicon layer deposited at this point of the present invention may vary, but typically the deposited polysilicon layer has a thickness of from about 5 to about 100 nm, with a thickness of from about 10 to about 50 nm being more highly preferred.

An optional barrier layer (not shown in the drawings) may be formed on the polysilicon layer prior to depositing the conductive material which is used as metallic gate electrode 18. The optional barrier layer is formed utilizing conventional deposition processes such as those mentioned above and the optional barrier layer may be composed of a diffusion barrier material such as SiN, TaN, TaSiN, WN, $TaSi_2$ and other like materials that can prevent diffusion of a conductive material therethrough.

A conductive material (which is used as metallic gate electrode 18) is formed on the layer of polysilicon or on the optional barrier layer utilizing a conventional deposition process such as CVD, plasma-assisted CVD, plating, sputtering and evaporation. The conductive material layer employed in the present invention includes any conductive material that has a sheet resistance of about 5 ohm/square or less. Illustrative examples of conductive materials that can be employed in the present invention include, but are not limited to: elemental metals such as W, Pt, Pd, Ru, Rh and Ir; silicides and nitrides of these elemental metals; and combinations or multilayers thereof.

When a metal silicide such as $WSi_x$ is employed, the silicide layer is formed utilizing a conventional silicide process in which a layer of elemental metal is first deposited, followed by the deposition of a polysilicon layer, annealing the structure and removing any remaining polysilicon that is not silicided utilizing a conventional wet etch process that is highly selective in removing polysilicon as compared to metal.

After forming the conductive material layer, a dielectric material such as a nitride or oxide (which is dielectric capping layer 20 of patterned gate stack region 14) is then formed atop the conductive layer utilizing a conventional deposition process such as CVD that is well known in the art.

Conventional lithography and etching is then employed to form patterned gate region 14 on top of patterned gate dielectric 12. Specifically, a photoresist (not shown in the drawings) is applied to the dielectric capping layer utilizing a conventional deposition technique well known in the art, the photoresist is then exposed to a pattern of radiation and a resist developer is then employed in developing the exposed photoresist. A conventional etching process such as reactive-ion etching, ion beam etching or plasma etching is then employed in transferring the pattern from the photoresist to the underlying layers. Note that the etching process may be carried out in a single step, or multiple etching processes may be employed. This etching step is stopped on the surface of semiconductor substrate 10, therefore the etching process removes exposed portions of the dielectric capping layer, the conductive material layer, the polysilicon layer as well as the gate dielectric material providing patterned gate stack region 14 formed on patterned gate dielectric 12, See FIG. 1.

After etching the gate stack region and the underlying gate dielectric, the patterned photoresist is removed utilizing a conventional stripping process well known to those skilled in the art. Placeholder dielectric 22 is then formed on the horizontal surfaces of the structure shown in FIG. 1, i.e., on top of patterned gate stack region 14 and on top of semiconductor substrate 10, so as to provide the structure shown in FIG. 2. The placeholder dielectric, which is composed of an oxide, nitride or oxynitride, is formed utilizing an anisotropic deposition process such as high density plasma deposition. A highly preferred placeholder dielectric is an oxide such as $SiO_2$. The thickness of placeholder dielectric 22 may vary, but typically, the placeholder dielectric has a thickness of from about 10 to about 50 nm, with a thickness of from about 15 to about 30 nm being more highly preferred.

Figure 2:
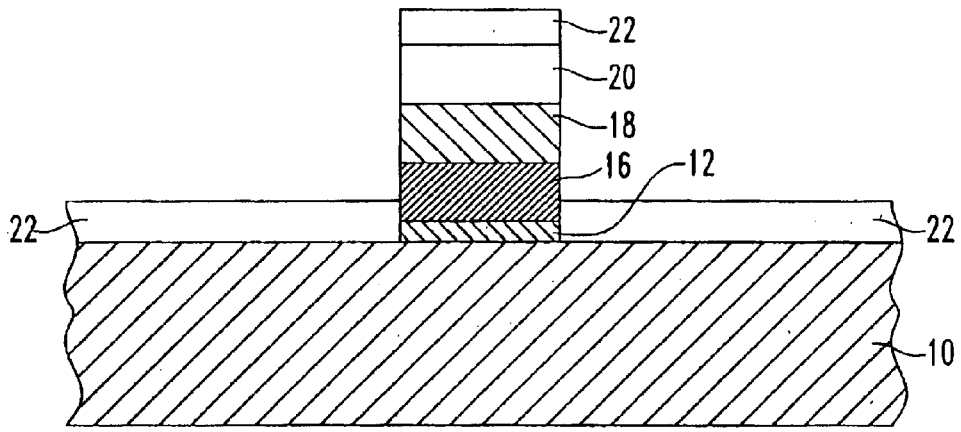
Figure 3:
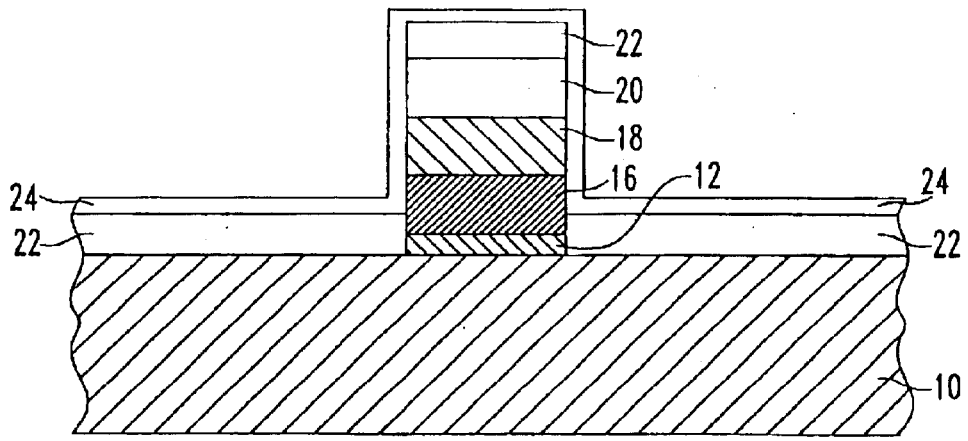

Next, conformal dielectric material 24 is formed on the horizontal and vertical surfaces of the structure of FIG. 2 utilizing a conventional deposition process such as CVD, plasma-assisted CVD, and chemical solution deposition so as to form the structure shown in FIG. 3. Conformal dielectric material 24 is composed of a dielectric material, i.e., oxide, nitride, or oxynitride, that is different from placeholder dielectric 22. For example, when the placeholder dielectric is composed of an oxide, then conformal dielectric material 24 is composed of a nitride such as SiN. In accordance with the present invention, the conformal dielectric material is a thin dielectric having a thickness of from about 3 to about 50 nm, with a thickness of from about 10 to about 20 nm being more highly preferred.

Figure 4:
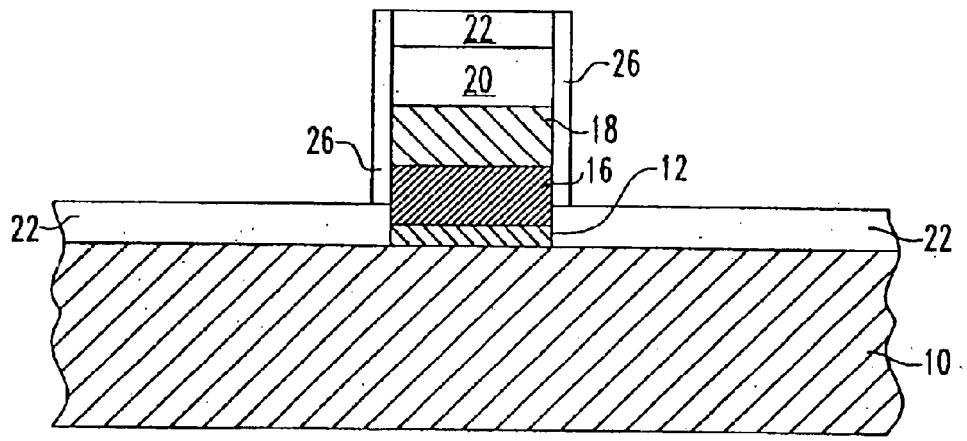

The conformal dielectric material that is shown in FIG. 3 is then etched utilizing a conventional anisotropic etching process so as to form sidewall spacers 26 on the vertical surfaces of patterned gate stack region 14. For example, a fluorine and carbon-containing plasma may be used in patterning conformal dielectric material 24 into sidewall spacers 26. The resultant structure that is formed after this etching process is shown, for example, in FIG. 4. It is noted that the sidewall spacers are present only on the upper portions of the patterned gate stack region, not on lower portions of the patterned gate stack region because of the presence of placeholder dielectric material 22. Specifically, the sidewall spacers are not present at gate corner regions that exist between the gate dielectric and the substrate as well as a portion of the polysilicon gate electrode formed atop the gate dielectric.

Figure 5:
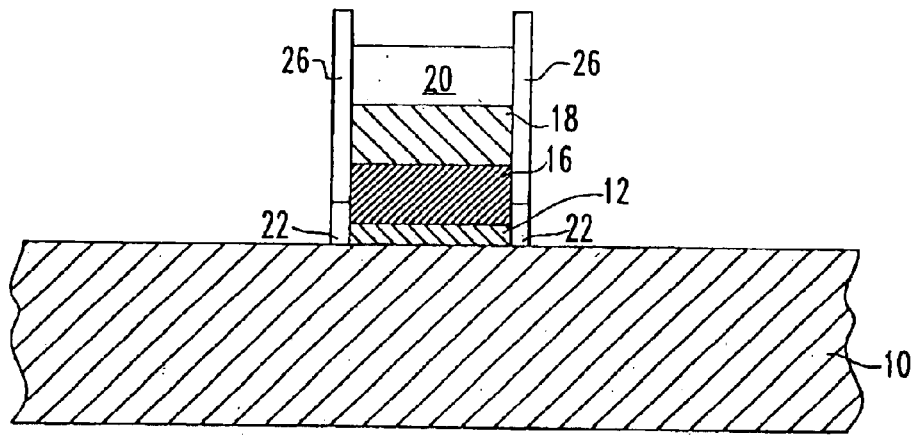

An optional embodiment of the present invention is shown in FIG. 5. In this optional embodiment, placeholder dielectric 22 that is not beneath sidewall spacers 26 is removed from horizontal surfaces of the structure, including the substrate and patterned gate stack region by utilizing an anisotropic etching process wherein a fluorine-containing plasma is used. Note that when this embodiment of the present invention is employed, portions of placeholder dielectric 22 remain beneath the sidewall spacers that are present on the patterned gate stack region.

Figure 6:
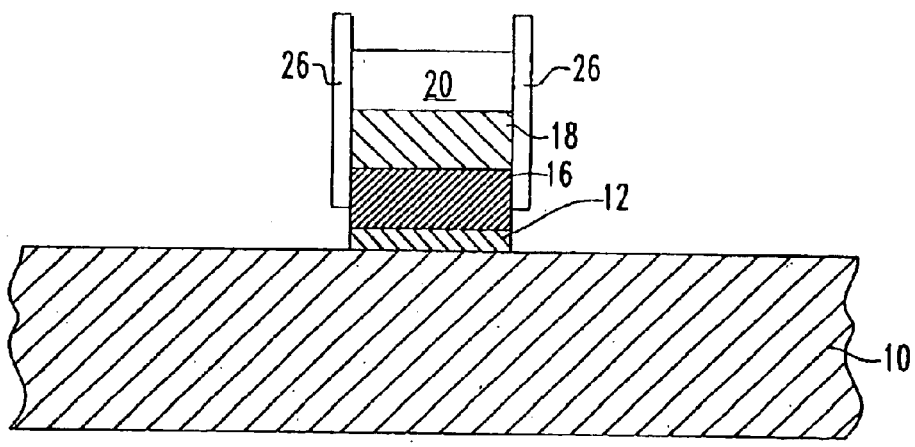

FIG. 6 shows the resultant structure after an isotropic (wet or dry) etching process is used. Note that when the optional embodiment described above is employed this etching step removes placeholder dielectric 22 from beneath sidewall spacers 26 that are present on upper potions of patterned gate stack region 14. When the optional embodiment of the present invention is not employed, this etching step by itself is capable of removing the entire layer of placeholder dielectric material from the structure. Typically, a fluorine-containing etchant is employed in the isotropic removal of placeholder dielectric 22 from the structure. It should be noted that this etching step exposes lower portions of the patterned gate region, i.e., the polysilicon region, as well as the patterned gate dielectric. Note that sidewall spacers 26 are now hanging from the sidewalls of the patterned gate region.

Figure 7:
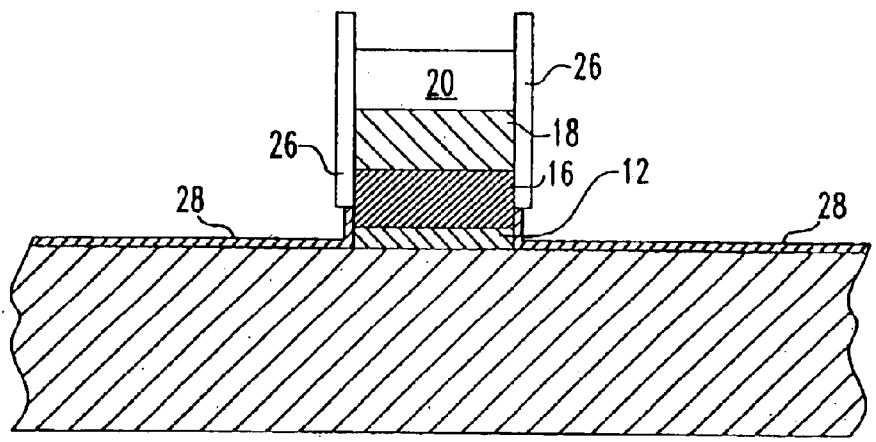

The structure illustrated in FIG. 6 is then subjected to a conventional sidewall oxidation process which is capable of growing thermal oxide layer 28 on the exposed sidewalls of the patterned gate stack region, i.e., patterned polysilicon gate electrode 16; See FIG. 7. The sidewall oxidation process is carried out at a temperature of about 400° C. or above in an oxygen-containing gas atmosphere that may, or may not be mixed with an inert gas such as He, Ar or $N_2$. More preferably, the sidewall oxidation process is carried out at a temperature of from about 1000° to about 1100° C. in $O_2$ and $H_2O$. Note that only the polysilicon portion of the patterned gate stack region contains the thermal oxide layer.

Figure 8:
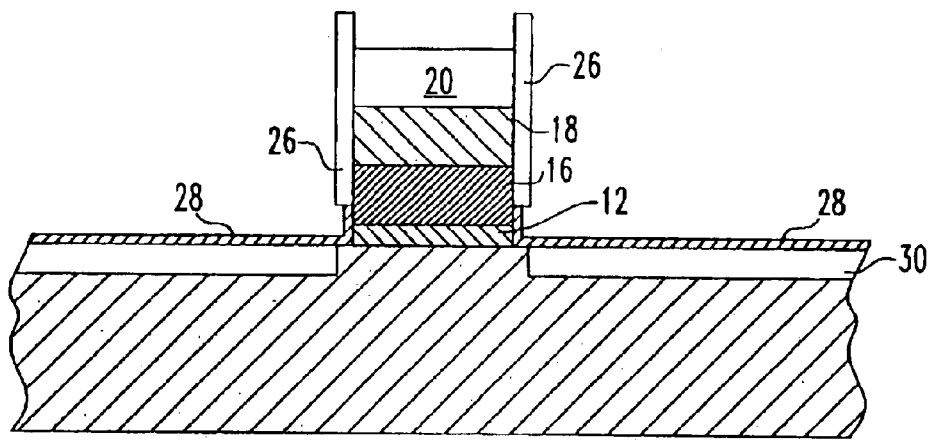

Following this partial sidewall oxidation process, heavily doped source/drain diffusion regions 30 are formed in the surface of semiconductor substrate 10 so as to provide the structure shown, for example, in FIG. 8. The heavily doped source/drain diffusion regions are formed by implanting a dopant into the substrate utilizing a conventional ion implantation process. The ion implantation process used in forming the heavily doped source/drain diffusion regions is carried out utilizing an ion dose of about 1E13 $cm^{-2}$ or greater, with an ion dose of from about 1E14 to about 1E15 $cm^{-2}$ being more highly preferred.

Following the ion implantation process, the heavily doped source/drain diffusion regions are activated by utilizing a conventional annealing process that operates at a temperature of about 1000° C. or above, for a time period of from about 30 seconds or less. More preferably, this activation annealing process is carried out at a temperature of about 1050° C. for a time period of about 10 seconds. Note that the activation-annealing step may be performed utilizing other temperatures and times that are well known to those skilled in the art. The species and impurity type used to implant the source/drain diffusions will be selected to form nFET and pFET transistors as is known in the art.

Figure 9:
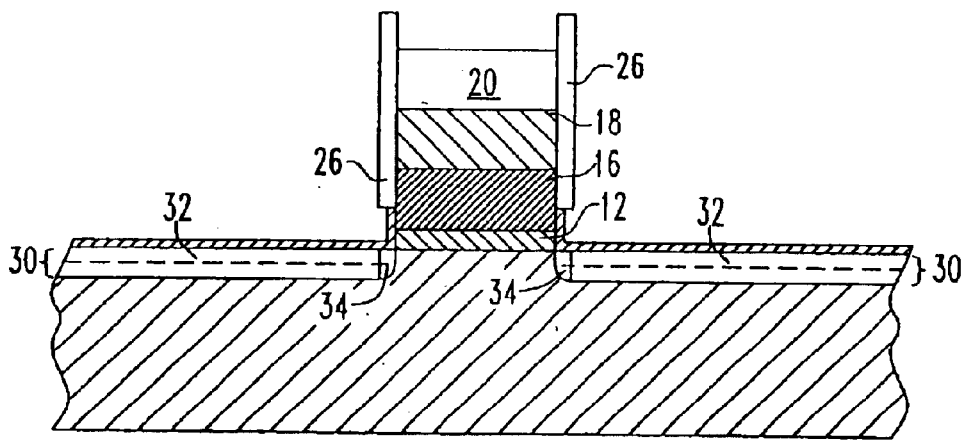

As stated above, the activation of the heavily doped source/drain diffusion regions is carried out before formation of lightly doped source/drain regions 32 and/or halo implant regions 34 in semiconductor substrate 10. These regions are depicted in FIG. 9. The lightly doped source/drain regions are formed by ion implanting a dopant into the substrate utilizing a conventional ion implantation process which includes normally incident or angled implant processes. Specifically, the lightly doped source/drain regions are formed utilizing an ion dose of about 1E14 $cm^{-2}$ or less, with an ion dose of from about 1E12 to about 1E13 $cm^{-2}$ being more highly preferred. Following the implantation of the lightly doped source/drain regions into the surface of the substrate, halo implant regions 34 may be formed in the substrate utilizing a conventional halo implantation process that is well known to those skilled in the art. The halo implant region is labeled as 34 in FIG. 9 and it is formed preferably by an angled implant process. Note that present invention contemplates the formation of only the lightly doped source/drain regions, only the halo implant regions, or both.

It is noted that the term "heavily doped source/drain diffusion regions" denotes diffusion regions that have a dopant concentration on the order of about 1E19 cm$^{-3}$ or above, with a dopant concentration of from about 1E19 to about 1E20 cm$^{-3}$ being more highly preferred. It is noted that the term "lightly doped source/drain regions" denotes diffusion regions that have a dopant concentration on the order of less than about 1E19 cm$^{-3}$, with a dopant concentration of about 1E18 cm$^{-3}$ or less being more highly preferred.

Following these ion implantation processes, the lightly doped source/drain regions, and/or halo implant regions are activated by utilizing a conventional annealing process that operates at a temperature of about 1000° C. or above, for a time period of from about 30 seconds or less. More preferably, this activation annealing process is carried out at a temperature of from about 1000° to about 1050° C. for a time period of from about 5 to about 7 seconds. Note that the activation-annealing step may be performed utilizing other temperatures and times that are well known to those skilled in the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A semiconductor structure comprising:
    a semiconductor substrate comprising a patterned gate region located atop a patterned gate dielectric, said patterned gate region including at least a metallic gate electrode located atop a polysilicon gate electrode;
    sidewall spacers positioned on an upper portion of said patterned gate region including at least said metallic gate electrode, said sidewall spacers have a first thickness; and
    a thermal oxide layer having a second thickness located on lower portions of said patterned gate region including a portion of said polysilicon gate electrode but not said metallic gate electrode, wherein said first thickness is greater than said second thickness, and a differential between said first thickness and said second thickness forms a recess.

2. The semiconductor structure of claim 1 wherein semiconductor substrate comprises a semiconductor material selected from the group consisting of Si, Ge, SiGe, GaAs, InAs, InP, Si/Si, Si/SiGe, and silicon-on-insulators.

3. The semiconductor structure of claim 2 wherein said semiconductor substrate is comprised of Si.

4. The semiconductor structure of claim 1 wherein said patterned gate dielectric is comprised of an oxide, a nitride, an oxynitride or any combination thereof.

5. The semiconductor structure of claim 4 wherein said patterned gate dielectric is comprised of an oxide selected from the group consisting of $SiO_2$, $ZrO_2$, $Ta_2O_5$, and $Al_2O_3$.

6. The semiconductor structure of claim 1 wherein said polysilicon gate electrode is comprised of a doped polysilicon layer.

7. The semiconductor structure of claim 1 wherein said metallic gate electrode is comprised of a conductive material having a sheet resistance of about 5 ohm/square or less.

8. The semiconductor structure of claim 1 wherein said metallic gate electrode is comprised of an elemental metal, a silicide of an elemental metal, a nitride of an elemental metal and combinations thereof.

9. The semiconductor structure of claim 8 wherein said elemental metal is selected from the group consisting of W, Pt, Pd, Ru, Rh and Ir.

10. The semiconductor structure of claim 1 wherein said patterned gate region further includes a dielectric capping layer formed on said metallic gate electrode.

11. The semiconductor structure of claim 10 wherein said dielectric capping layer is comprised of an oxide or nitride.

12. The semiconductor structure of claim 1 wherein said sidewall spacers are comprised of an oxide, a nitride or an oxynitride.

13. The semiconductor structure of claim 1 further comprising heavily doped source/drain diffusion regions formed in said substrate about said patterned gate region.

14. The semiconductor structure of claim 13 wherein said heavily doped source/drain diffusion regions have a dopant concentration on the order of about 1E19 cm$^{-3}$ or above.

15. The semiconductor structure of claim 14 further comprising lightly doped source/drain regions formed in said substrate adjoining said heavily doped source/drain diffusion regions.

16. The semiconductor structure of claim 15 wherein said lightly doped source/drain regions have a dopant concentration of less than about 1E19 cm$^{-3}$.

17. The semiconductor structure of claim 14 further comprising halo implant regions formed in said substrate.

18. The semiconductor structure of claim 1 wherein said first thickness is from about 10 to about 50 nm.

19. The semiconductor structure of claim 1 wherein said first thickness is from about 15 to about 30 nm.

20. The semiconductor structure of claim 1 wherein said second thickness is from about 3 to about 50 nm.

21. The semiconductor structure of claim 1 wherein said second thickness is from about 10 to about 20 nm.

* * * * *